United States Patent
Lee

(10) Patent No.: US 7,408,138 B2
(45) Date of Patent: Aug. 5, 2008

(54) ANALOG-TO-DIGITAL CONVERTER WITH NOISE COMPENSATION IN CMOS IMAGE SENSOR

(75) Inventor: Myoung-Su Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 75 days.

(21) Appl. No.: 11/488,516

(22) Filed: Jul. 18, 2006

(65) Prior Publication Data

US 2007/0029467 A1 Feb. 8, 2007

(30) Foreign Application Priority Data

Aug. 3, 2005 (KR) .................... 10-2005-0071139

(51) Int. Cl.
*H01L 27/00* (2006.01)
*H01J 40/14* (2006.01)

(52) U.S. Cl. ................ 250/208.1; 250/214 A; 250/214 DC; 341/155; 348/308

(58) Field of Classification Search ........... 250/208.1, 250/214 R, 214 A, 214 DC, 214 C; 341/155, 341/161, 169; 330/59, 110, 308; 348/241, 348/300, 303, 308

See application file for complete search history.

(56) References Cited

U.S. PATENT DOCUMENTS

| | | | |
|---|---|---|---|
| 6,348,681 B1 * | 2/2002 | Kindt et al. ............... | 250/208.1 |
| 6,617,567 B2 | 9/2003 | Mukherjee et al. ......... | 250/214 |
| 6,753,912 B1 | 6/2004 | Wayne .................... | 348/241 |
| 7,250,897 B2 * | 7/2007 | Oh ........................ | 341/169 |

OTHER PUBLICATIONS

Korean Patent Application No. 1020010078123 to Choi, having Publication date of Jun. 21, 2002 (w/English Abstract page).
Japanese Patent Application No. 11-093046 to Yasushi, having Publication date of Oct. 13, 2000 (w/English Abstract page).
Korean Patent Application No. 1020030002601 to Masatoshi, having Publication date of Aug. 14, 2003 (w/ English Abstract page).
Japanese Patent Application No. 08-325642 to Kazuya, having Publication date of Jan. 27, 1998 (w/ English Abstract page).
Japanese Patent Application No. 2001-358892 to Nobuo et al., having Publication date of Jun. 6, 2003 (w/ English Abstract page).
Japanese Patent Application No. 2002-280534 to Takeshi, having Publication date of Apr. 15, 2004 (w/ English Abstract page).

* cited by examiner

*Primary Examiner*—Kevin Pyo
(74) *Attorney, Agent, or Firm*—Monica H. Choi

(57) ABSTRACT

An analog-to-digital converter includes an amplifying unit and a noise compensation unit. The amplifying unit amplifies a difference between a trip point voltage and a modified signal voltage. The trip point voltage has a first power noise component, and the noise compensation unit incorporates a second power noise component into an original signal voltage to generate the modified signal voltage. Thus, the power noise components are cancelled in the difference.

20 Claims, 4 Drawing Sheets

ANALOG-TO-DIGITAL CONVERTER WITH NOISE COMPENSATION IN CMOS IMAGE SENSOR

BACKGROUND OF THE INVENTION

This application claims priority to Korean Patent Application No. 2005-71139, filed on Aug. 3, 2005 in the Korean Intellectual Property Office, the disclosure of which is incorporated herein in its entirety by reference.

1. Field of the Invention

The present invention relates generally to analog-to-digital conversion in CMOS (complementary metal oxide semiconductor) image sensors, and more particularly, to compensating for power noise during such analog-to-digital conversion.

2. Description of the Related Art

An Image sensor converts an image into electrical signals using photo-conversion. An image sensor is generally classified into either a charge-coupled device (CCD) type or a complementary metal-oxide-semiconductor (CMOS) image sensor (CIS) type depending on the mechanism for generating and transferring charge carriers.

The CCD image sensor transfers electrons generated from incident light to an output port using gate pulses, and such transferred electrons are then transformed into a voltage. The CCD image sensor has relatively high optical sensitivity with reduced noise because an optical current is extracted after an accumulation time. However, the CCD image sensor disadvantageously has a complicated driving mechanism for continuous transfer of charge carriers. Additionally, the CCD image sensor consumes relatively high power.

The CMOS image sensor transforms electrons generated by incident light into a voltage in a pixel circuit. Such a voltage is output through a plurality of CMOS switches. The CMOS image sensor is generally inferior to the CCD image sensor in electro-optical characteristics. However, the CMOS image sensor has lower power consumption and higher integration density than the CCD image sensor.

In the CMOS image sensor, charge carriers are accumulated for a relatively short period of time before being converted into a voltage within each pixel circuit. Thus, such a voltage is more sensitive to noise such as from power voltage sources as the voltage signal is generated and transmitted.

An example CMOS image sensor includes an analog-to-digital (ADC) converter with single-ended inverting amplifiers instead of a differential comparator, for minimizing power consumption. Such a CMOS image sensor is especially amenable for use in portable electronic devices. However, the single-ended inverting amplifier has a trip point voltage that may be prone to power noise. Such noise for the trip point voltage causes image distortion. Thus, a CMOS image sensor with single-ended amplifiers having minimized image distortion from such power noise is desired.

SUMMARY OF THE INVENTION

Accordingly, embodiments of the present invention provide cancellation of power noise in the trip point voltage for a singled-ended inverting amplifier in an analog-to-digital converter.

An analog-to-digital converter according to an aspect of the present invention includes a first amplifying unit and a noise compensation unit. The first amplifying unit is for amplifying a difference between a trip point voltage and a modified signal voltage to generate a first amplified voltage. The trip point voltage has a first power noise component.

The noise compensation unit incorporates a second power noise component into an original signal voltage to generate the modified signal voltage. The analog-to-digital converter also includes a conversion unit for generating a digital signal indicating the difference between the trip point voltage and the modified signal voltage.

In one embodiment of the present invention, the second power noise component is substantially equal to the first power noise component such that the first and second power noise components are completely canceled in the difference.

In another embodiment of the present invention, the noise compensation unit includes first and second power capacitors. The first power capacitor is coupled between a high power voltage source and a common node, and the second power capacitor is coupled between a low power voltage source and the common node.

In a further embodiment of the present invention, the first amplifying unit includes a first inverting amplifier, a first amplifier switch, and a first amplifier capacitor. The first amplifier switch is coupled between an input and an output of the first inverting amplifier. The first amplifier capacitor is coupled between the common node and the input of the first inverting amplifier.

In another embodiment of the present invention, the analog-to-digital converter further includes a second amplifying unit for further amplifying the first amplified voltage to generate a second amplified voltage. The second amplifying unit includes a second inverting amplifier, a second amplifier switch, and a second amplifier capacitor. The second amplifier switch is coupled between an input and an output of the second inverting amplifier. The second amplifier capacitor is coupled between the output of the first inverting amplifier and the input of the second inverting amplifier.

In a further embodiment of the present invention, the analog-to-digital converter further includes a switching unit having a first switch, a switching capacitor, and a second switch. The first switch is coupled between an analog voltage source and the common node. The analog voltage source generates the original signal voltage and a reset signal voltage used for generating the trip point voltage. The switching capacitor has a first terminal coupled to the common node. The second switch is coupled between a second terminal of the switching capacitor and a ramp signal generator that generates a ramping voltage.

With such a switching unit, the conversion unit includes a counter that counts from when the ramping voltage is applied to the second terminal of the switching capacitor to a transition of the second amplified voltage, for generating the digital signal.

In this manner, the power noise component in the trip point voltage for the first inverting amplifier is cancelled. Such an analog-to-digital converter may be used to particular advantage within a CMOS image sensor. In that case, the analog voltage source is a pixel circuit that generates an image signal voltage as the original signal voltage. However, the analog-to-digital converter may also be used for any other application or electronic device having analog-to-digital conversion.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, and 4 refer to elements having similar structure and/or function.

DETAILED DESCRIPTION OF THE INVENTION

Figure 1:
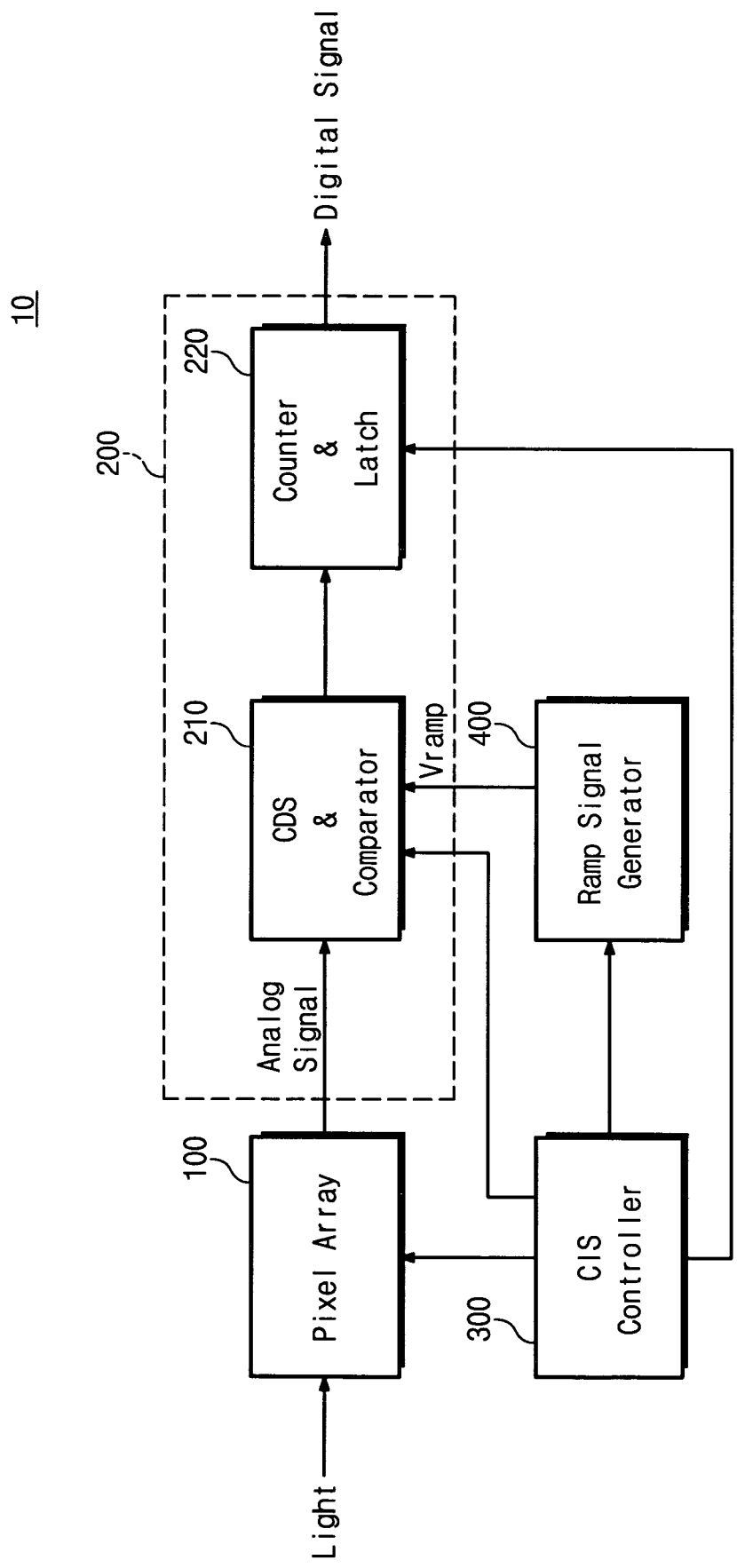
FIG. 1 is a block diagram of a CMOS (complementary metal oxide semiconductor) image sensor, according to an embodiment of the present invention.

FIG. 1 is a block diagram of a CMOS (complementary metal oxide semiconductor) image sensor 10 according to an embodiment of the present invention. The CMOS image sensor (CIS) 10 includes a pixel array 100, a correlated double-sampling (CDS) ADC (analog-to-digital converter) 200, a CIS controller 300, and a ramp signal generator 400.

The pixel array 100 is comprised of a plurality of unit pixel circuits that generate electric signals from an image. Each unit pixel circuit includes a photodiode for transforming incident light for such an image into an analog image signal and for outputting such an image signal. The CDS ADC 200 includes a CDS (correlated double sampling) and comparator unit 210 and a conversion unit 220 that is implemented with a counter and a latch in one embodiment of the present invention. The CDS ADC 200 also includes a CIS controller 300 and a ramp signal generator 400.

The CIS controller 300 generates control signals, R, T, and S for operating the pixel array 100, and generates signals for controlling the operation of the CDS ADC 200 and the ramp signal generator 400. The ramp signal generator 400 generates an analog ramp signal Vramp in response to a control signal from the CIS controller 300.

Figure 2:
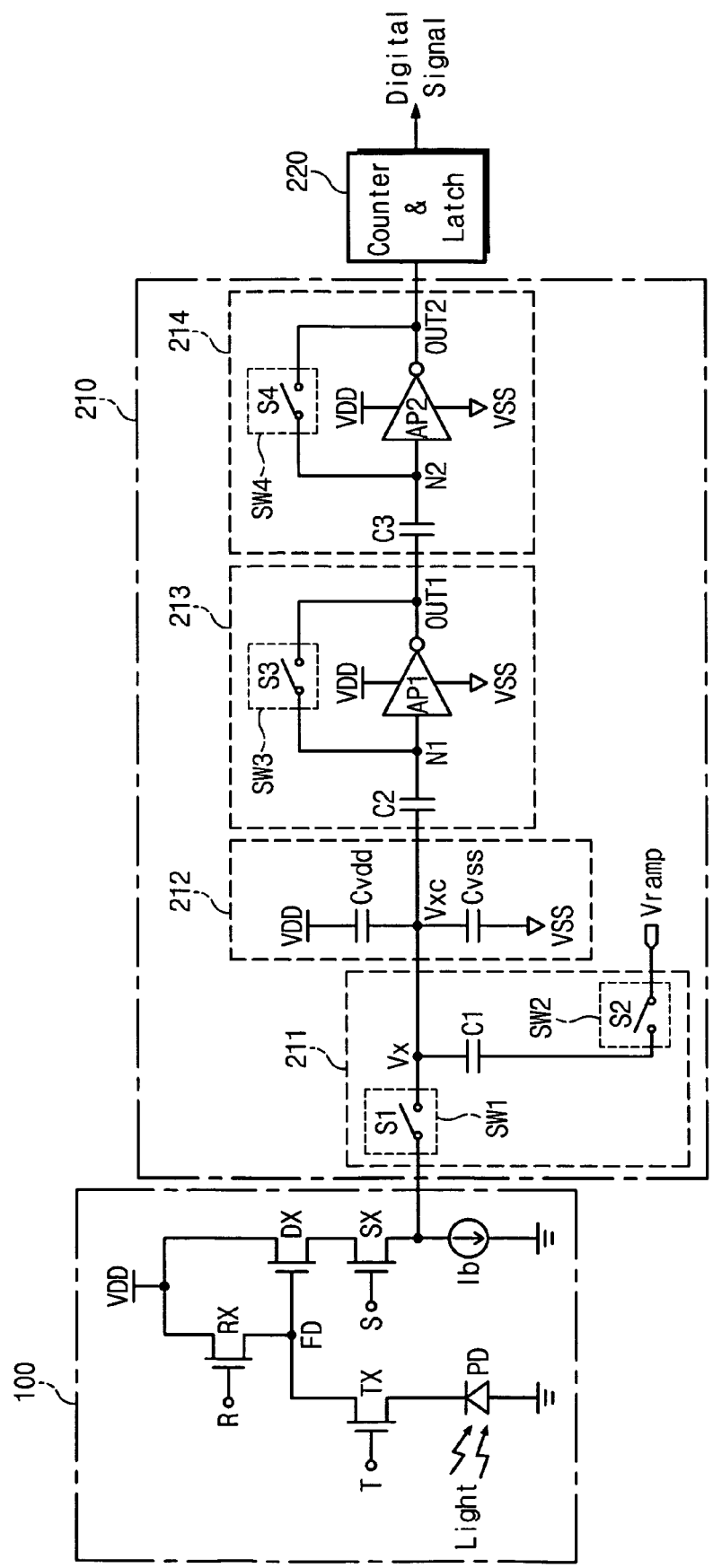
FIG. 2 is a circuit diagram of a pixel circuit and a CDS (correlated double sampling) ADC (analog-to-digital converter) of FIG. 1, according to an embodiment of the present invention.

FIG. 2 shows a circuit diagram of an example pixel circuit in the pixel array 100 and of the CDS ADC 200 in FIG. 1. The pixel array 100 is comprised of an array of more numerous pixel circuits. However, one example pixel circuit 100 is illustrated in FIG. 2 for simplicity and clarity of illustration and description.

The example pixel circuit 100 in FIG. 2 includes a photodiode PD, a transfer transistor TX, a drive transistor DX, a reset transistor RX, a selection transistor SX, and a current source 1b. The photodiode PD converts incident light for an image into charge carriers. The photodiode PD is coupled between the transfer transistor TX and a ground node.

The transfer transistor TX when turned on by the T control signal transfers charge carriers generated by the photodiode PD to a floating diffusion node FD. The drive transistor DX generates a source-to-drain current that is proportional to such transferred charge carriers at the gate of the drive transistor DX. The reset transistor RX when turned on by the R control signal applies a reset voltage Vres at the floating diffusion node FD.

The selection transistor SX when turned on by the S control signal for selecting the pixel circuit 100 transfers the current of the drive transistor DX to the CDS and comparator unit 210. The T, R, and S control signals applied on the gates of the transfer transistor TX, the reset transistor RX, and the selection transistor SX, respectively, are generated by the CIS controller 300 of FIG. 1.

The CDS and comparator unit 210 includes a switching unit 211, a noise compensation unit 212, a first amplifying unit 213, and a second amplifying unit 214.

The switching unit 211 is coupled between the pixel circuit 100 and the noise compensation unit 212. The switching unit 211 includes first and second switches SW1 and SW2 and a switching capacitor C1. The first switch SW1 is coupled between the pixel circuit 100 and a common node Vx of the noise compensation unit 212. The switching capacitor C1 is coupled between the common node Vx and one terminal of the second switch SW2 having another terminal coupled to the ramp signal generator 400.

The noise compensation unit 212 is coupled between the switching unit 211 and the first amplifying unit 213. The noise compensation unit 212 includes a first power capacitor Cvdd and a second power capacitor Cvss. The first power capacitor Cvdd is coupled between a high power voltage source VDD and the common node Vx. The second power capacitor Cvss is coupled between a low power voltage source VSS and the common node Vx.

The low power voltage source VSS is the ground node in one embodiment of the present invention. However, the present invention may be practiced with any other low power voltage source VSS providing a voltage level that is lower than for the high power voltage source VDD.

The first amplifying unit 213 includes a first amplifier capacitor C2, a first inverting amplifier AP1, and a first amplifier switch SW3. The first amplifier capacitor C2 is coupled between the common node Vx of the noise compensation unit 212 and an input of the first inverting amplifier AP1. The first amplifier switch SW3 is coupled between the input and an output OUT1 of the first inverting amplifier AP1.

The second amplifying unit 214 includes a second amplifier capacitor C3, a second inverting amplifier AP2, and a second amplifier switch SW4. The second amplifier capacitor C3 is coupled between the output of the first inverting amplifier AP1 and an input of the second inverting amplifier AP2. The second amplifier switch SW4 is coupled between the input and an output of the second inverting amplifier AP2. The output OUT2 of the second inverting amplifier AP2 is coupled to the conversion unit 220.

Control signals S1, S2, S3, and S4 determine whether the switches SW1, SW2, SW3, and SW4, respectively, are opened or closed. Such control signals S1, S2, S3, and S4 are generated by the CIS controller 300 in FIG. 1.

Figure 3:
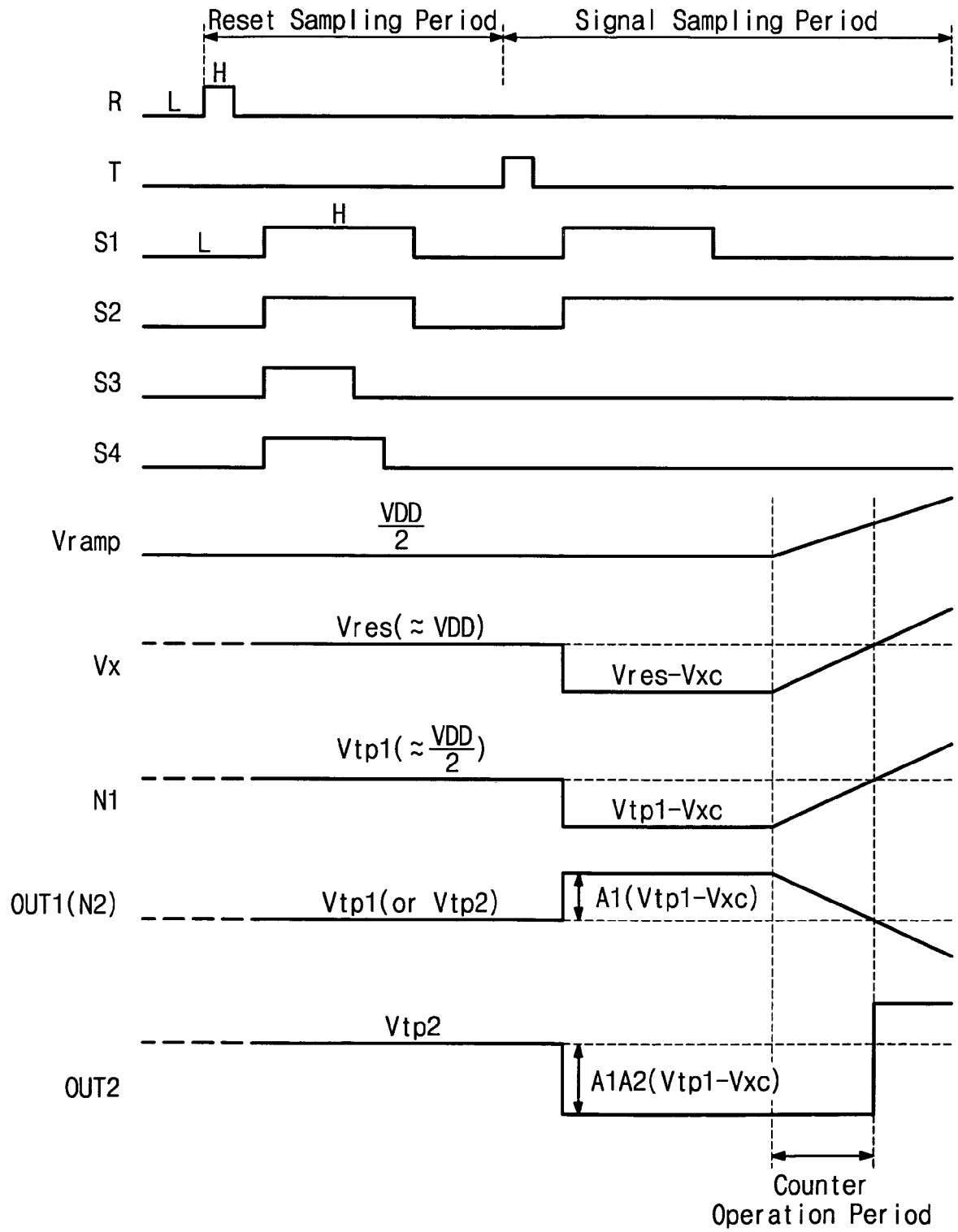
FIG. 3 is a timing diagram of signals during operation of the circuit of FIG. 2, according to an embodiment of the present invention.

FIG. 3 shows a timing diagram of signals during operation of the circuit of FIG. 2. Referring to FIGS. 2 and 3, during a reset sampling period, the reset control signal R is activated to a logical high state while the transfer control signal T remains at the logical low state. Thus, the reset transistor RX is turned on while the transfer transistor TX is turned off such that the reset voltage Vres=VDD is applied at the floating diffusion node FD.

Also during the reset sampling period, the switches SW1, SW2, SW3, and SW4 are turned on in response to the switch control signals S1, S2, S3, and S4 such that the reset voltage Vres=VDD is applied on the common node Vx. The ramp voltage Vramp is generated by the ramp signal generator 400 to have a level of about VDD/2 during the reset sampling period.

Further during the reset sampling period, the input node N1 for the first inverting amplifier AP1 and the input node N2 for the second inverting amplifier AP2 are set to a first trip point voltage Vtp1 and a second trip point voltage Vtp2, respectively. In one example embodiment of the present invention, Vtp1=Vtp2.

A trip point voltage for an inverting amplifier AP1 or AP2 is a threshold voltage at which the input voltage of the amplifier is substantially same as the output voltage of the amplifier. With the amplifier switches S3 and S4 closed, each of the first and second inverting amplifiers AP1 and AP2 has a feed-back configuration with the output being fed-back to the input. Thus, the trip point voltages Vtp1 and Vtp2 formed at nodes N1 and N2 are each about VDD/2. Such trip point voltages Vtp1 and Vtp2 are each stored in the amplifier capacitors C2 and C3, respectively.

Next during a signal sampling period, the transfer control signal T is set to the logic high state to turn on the transfer transistor TX. Thus, charge carriers generated from the photodiode PD are transferred to the floating diffusion node FD.

Subsequently, the first switch SW1 is turned on such that the common node Vx is driven to have a voltage difference (Vres–Vxc) between the reset voltage Vres and a modified signal voltage Vxc. The modified signal voltage Vxc is determined in part by the amount of charge carriers generated by the photodiode PD and transferred to the floating diffusion node FD that generates an original signal voltage Vsig.

Consequently, the input node N1 of the first inverting amplifier AP1 is set to the voltage difference (Vtp1–Vxc) between the trip point voltage Vtp1 and the modified signal voltage Vxc. The first inverting amplifier AP1 amplifies such an input voltage (Vtp1–Vxc) to generate the output OUT1 as A1*(Vtp1–Vxc), with A1 being a first amplification factor of the first inverting amplifier AP1.

The output OUT1=A1*(Vtp1–Vxc) of the first inverting amplifier AP1 is then further amplified by the second inverting amplifier AP2 to generate the output OUT2 as A2*A1* (Vtp1–Vxc), with A2 being a second amplification factor of the second inverting amplifier AP2.

Thereafter, the ramp signal generator 400 is controlled to ramp up the ramp signal Vramp. From the time point when the ramp signal Vramp starts to ramp up, the voltages of the nodes Vx and N1 increase at the same rate as the ramp signal Vramp. Also the conversion unit 220 is controlled by the CIS controller 300 to count from the time point when the ramp signal Vramp starts to ramp up until the output OUT2 from the second inverting amplifier AP2 makes a transition (i.e., for the counter operation period in FIG. 3).

The output OUT2 of the second inverting amplifier AP2 makes a transition when the voltage at the input node N1 of the first inverting amplifier AP1 reaches the trip point voltage Vtp1 from the steady ramp up of the ramp signal Vramp. Thus, the time period from when the ramp signal Vramp starts to ramp up and when the output OUT2 of the second inverting amplifier makes a transition indicates the level of the original signal voltage Vsig.

The conversion unit 220 counts for such a time period, and the result of such a count is a digital signal indicating the level of the analog signal voltage Vsig. Such a digital signal is latched in the conversion unit 220 for indicating a gray level of the light received by the photodiode PD.

Figure 4:
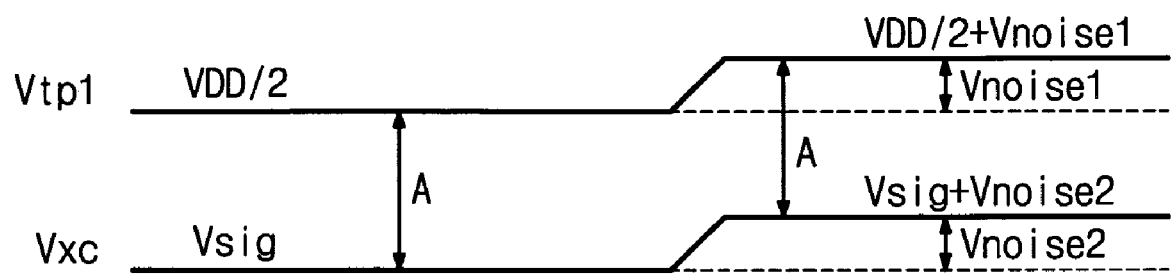
FIG. 4 shows an example of a trip point voltage and a modified signal voltage for illustrating cancellation of power noise components in the circuit of FIG. 2, according to an embodiment of the present invention.

In an aspect of the present invention, a first power noise component of the trip point voltage Vtp1 is compensated by adjusting an original signal voltage Vsig from the pixel circuit 100 to generate the modified signal voltage Vxc. FIG. 4 shows a waveform diagram of an example trip point voltage Vtp1 and an example modified signal voltage Vxc.

The trip point voltage Vtp1 has a first power noise component Vnoise1 added to an ideal lower level that is about VDD/2 in the example of FIG. 4. The first power noise component Vnoise1 of the trip point voltage arising from noise at the power sources VDD and VSS is represented by the following Equation 1:

$$V_{noise1} = \frac{V_{DDN} + V_{SSN}}{2} \quad \text{[Equation 1]}$$

In Equation 1, $V_{DDN}$ and $V_{SSN}$ denote noise components of the power sources VDD and VSS, respectively.

Further referring to FIG. 4, assume that the signal voltage Vsig is an original signal voltage generated from the pixel circuit 100. In that case, the noise compensation circuit 212 generates the modified signal voltage Vxc at the common node Vx which is expressed by the following Equation 2:

$$V_{XC} = V_{sig} + V_{noise2} = V_{sig} + \left( (V_{DDN} + V_{SSN}) * \frac{C_{vdd}}{C_{vdd} + C_{vss}} \right) \quad \text{[Equation 2]}$$

Thus, the noise compensation circuit 212 introduces a power noise component Vnoise2 into the original signal voltage Vsig to generate the modified signal voltage $V_{XC}$ at the common node Vx. As illustrated in the right portion of FIG. 4 for example, the power noise component Vnoise2 is added on to the lower original signal voltage Vsig to generate the modified signal voltage Vxc.

If each of the power capacitors Cvdd and Cvss has substantially a same capacitance, the second power noise component Vnoise2 is substantially equal to the first power noise component Vnoise1. Thus, such power noise components are completely cancelled in the correlated double sampling process from using the difference (Vtp1–Vxc).

Such an advantageous feature is shown in FIG. 4 by the same difference A between the ideal case of no power noise in the trip point voltage Vtp1 and the original signal voltage Vsig, and between the trip point voltage Vtp1 having the power noise component Vnoise1 and the modified signal voltage Vxc having the power noise component Vnoise2. The constant difference A indicates the level of the original signal voltage Vsig. Such cancellation of the power noise components minimizes distortion of the image captured by the pixel array 100.

The foregoing is by way of example only and is not intended to be limiting. For example, any numbers or number of elements described and illustrated herein is by way of example only. In addition, the present invention has been described for the CDS ADC 210 being used within the CMOS image sensor 10. However, the CDS ADC 210 may also advantageously be applied for other electronic devices or applications. In that case, any analog voltage source, aside from the example pixel circuit 100, generates the original signal voltage used for generating the modified signal voltage Vxc, and generates the reset voltage used for generating the trip point voltage Vtp1.

The present invention is limited only as defined in the following claims and equivalents thereof.

What is claimed is:

1. An analog-to-digital converter comprising:
   a first amplifying unit for amplifying a difference between a trip point voltage and a modified signal voltage to generate a first amplified voltage, the trip point voltage having a first power noise component;
   a noise compensation unit that incorporates a second power noise component into an original signal voltage to generate the modified signal voltage; and
   a conversion unit for generating a digital signal indicating the difference.

2. The analog-to-digital converter of claim 1, wherein the second power noise component is substantially equal to the first power noise component such that the first and second power noise components are canceled in the difference.

3. The analog-to-digital converter of claim 1, wherein the noise compensation unit includes:
   a first power capacitor coupled between a high power voltage source and a common node; and
   a second power capacitor coupled between a low power voltage source and the common node.

4. The analog-to-digital converter of claim 3, wherein the first amplifying unit includes:
   a first inverting amplifier;
   a first amplifier switch coupled between an input and an output of the first inverting amplifier; and
   a first amplifier capacitor coupled between the common node and the input of the first inverting amplifier.

5. The analog-to-digital converter of claim 4, further comprising:
   a second amplifying unit for further amplifying the first amplified voltage to generate a second amplified voltage, the second amplifying unit including:
   a second inverting amplifier;
   a second amplifier switch coupled between an input and an output of the second inverting amplifier; and
   a second amplifier capacitor coupled between the output of the first inverting amplifier and the input of the second inverting amplifier.

6. The analog-to-digital converter of claim 5, further comprising:
   a switching unit including:
   a first switch coupled between an analog voltage source and the common node, wherein the analog voltage source generates the original signal voltage and a reset signal voltage used for generating the trip point voltage;
   a switching capacitor having a first terminal coupled to the common node; and
   a second switch coupled between a second terminal of the switching capacitor and a ramp signal generator that generates a ramping voltage.

7. The analog-to-digital converter of claim 6, wherein the conversion unit includes a counter that counts from when the ramping voltage is applied to the second terminal of the switching capacitor to a transition of the second amplified voltage, for generating the digital signal.

8. The analog-to-digital converter of claim 6, wherein the analog voltage source is a pixel circuit of a CMOS (complementary metal oxide semiconductor) image sensor that generates an image signal voltage as the original signal voltage.

9. A CMOS (complementary metal oxide semiconductor) image sensor comprising:
   an array of pixel circuits, each pixel circuit generating an image signal voltage from an image;
   an analog-to-digital converter for generating a digital signal representing the image signal voltage; and
   a controller for generating control signals for controlling the pixel circuit and the analog-to-digital converter;
   wherein the analog-to-digital converter includes:
   a first amplifying unit for amplifying a difference between a trip point voltage and a modified signal voltage to generate a first amplified voltage, the trip point voltage having a first power noise component;
   a noise compensation unit that incorporates a second power noise component into the image signal voltage to generate the modified signal voltage; and
   a conversion unit for generating a digital signal indicating the difference.

10. The CMOS image sensor of claim 9, wherein the second power noise component is substantially equal to the first power noise component such that the first and second power noise components are canceled in the difference.

11. The CMOS image sensor of claim 9, wherein the noise compensation unit includes:
    a first power capacitor coupled between a high power voltage source and a common node; and
    a second power capacitor coupled between a low power voltage source and the common node.

12. The CMOS image sensor of claim 11, wherein the first amplifying unit includes:
    a first inverting amplifier;
    a first amplifier switch coupled between an input and an output of the first inverting amplifier; and
    a first amplifier capacitor coupled between the common node and the input of the first inverting amplifier.

13. The CMOS image sensor of claim 12, wherein the analog-to-digital converter further includes:
    a second amplifying unit for further amplifying the first amplified voltage to generate a second amplified voltage, the second amplifying unit including:
    a second inverting amplifier;
    a second amplifier switch coupled between an input and an output of the second inverting amplifier; and
    a second amplifier capacitor coupled between the output of the first inverting amplifier and the input of the second inverting amplifier.

14. The CMOS image sensor of claim 13, wherein the analog-to-digital converter further includes:
    a switching unit comprising:
    a first switch coupled between an analog voltage source and the common node, wherein the analog voltage source generates the original signal voltage and a reset signal voltage used for generating the trip point voltage;
    a switching capacitor having a first terminal coupled to the common node; and
    a second switch coupled between a second terminal of the switching capacitor and a ramp signal generator that generates a ramping voltage.

15. The CMOS image sensor of claim 14, wherein the conversion unit includes a counter that counts from when the ramping voltage is applied to the second terminal of the switching capacitor to a transition of the second amplified voltage, for generating the digital signal.

16. A method of performing CDS (correlated double sampling) analog-to-digital conversion within a CMOS (complementary metal oxide semiconductor) image sensor, comprising:
    generating a trip point voltage from a reset signal voltage, the trip point voltage having a first power noise component;
    generating an image signal voltage from an image;
    generating a modified signal voltage by incorporating a second power noise component into the image signal voltage;
    amplifying a difference between the trip point voltage and the modified signal voltage to generate a first amplified voltage; and
    generating a digital signal indicating the difference.

17. The method of claim 16, wherein the second power noise component is substantially equal to the first power noise component such that the first and second power noise components are canceled in the difference.

18. The method of claim 16, wherein the trip point voltage is generated from the reset signal voltage before the image signal voltage is generated.

19. The method of claim 16, further comprising:
amplifying the first amplified voltage to generate a second amplified voltage.

20. The method of claim 19, further comprising:
generating a ramping voltage that provides off-set to the first amplified voltage; and counting from when the ramping voltage begins to off-set the first amplified voltage to a transition of the second amplified voltage, for generating the digital signal.

* * * * *